United States Patent [19]
Toda

[11] Patent Number: 5,065,369
[45] Date of Patent: Nov. 12, 1991

[54] VIDEO MEMORY DEVICE
[75] Inventor: Haruki Toda, Yokohama, Japan
[73] Assignee: Kabushiki Kaisha Toshiba, Kawasaki, Japan
[21] Appl. No.: 407,310
[22] Filed: Sep. 14, 1989
[30] Foreign Application Priority Data
Sep. 21, 1988 [JP] Japan .................. 63-237396
[51] Int. Cl.⁵ .............................. G11C 7/00
[52] U.S. Cl. .................. 365/230.05; 365/230.03; 365/189.12
[58] Field of Search .............. 365/230.03, 230.05, 365/189.12, 219

[56] References Cited
U.S. PATENT DOCUMENTS

| 4,789,960 | 12/1988 | Willis | 365/189.12 |
| 4,891,794 | 1/1990 | Hush et al. | 365/230.05 |
| 4,937,788 | 6/1990 | Harada | 365/230.05 |
| 4,984,214 | 1/1991 | Hiltebeitel et al. | 365/230.05 |

FOREIGN PATENT DOCUMENTS
60-115088 6/1985 Japan.

Primary Examiner—Joseph A. Popek
Attorney, Agent, or Firm—Foley & Lardner

[57] ABSTRACT

A video memory device includes a RAM and a plurality of SAMs. RAM is constructed of a plurality of memory cells disposed in a matrix. Data are transferred between a memory cell designated by an address and a RAM port. Each SAM is constructed as a multi-word length type and connected to each of a plurality of columns of RAM. Multi-bit data are transferred between each SAM and RAM, and are serially input/output via a plurality of SAM ports.

13 Claims, 6 Drawing Sheets

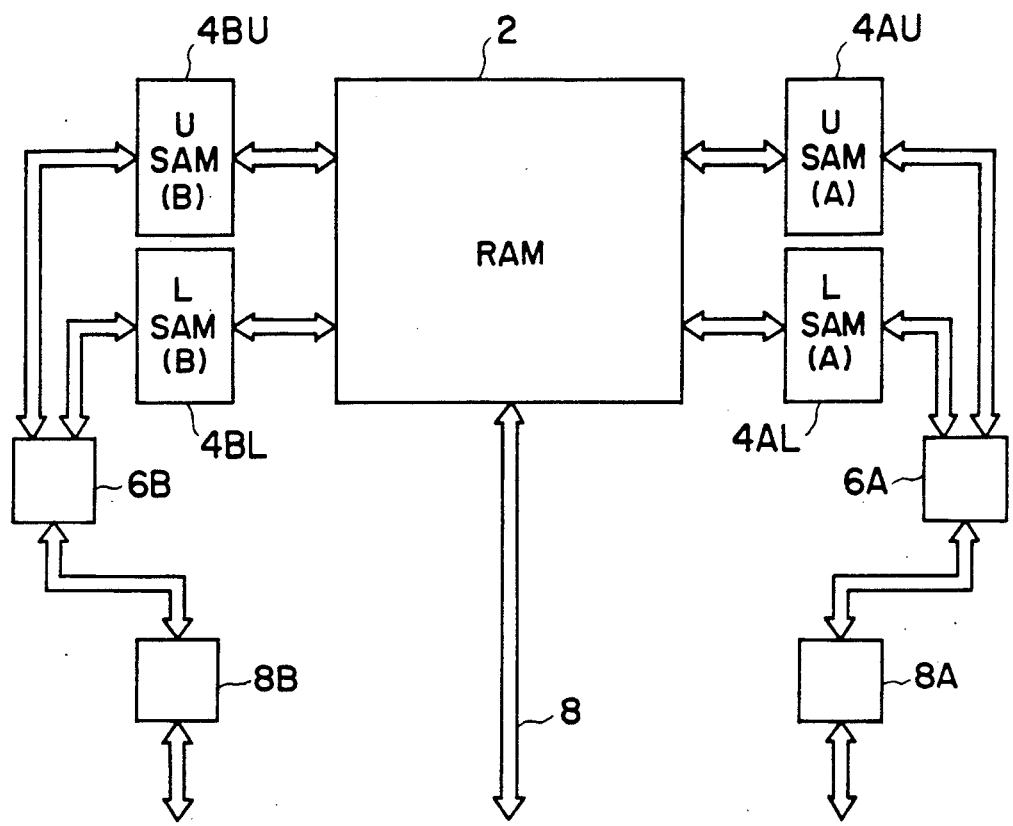
F I G. 6

VIDEO MEMORY DEVICE

FIELD OF THE INVENTION

The present invention relates to a video memory device, and more particularly to a video memory device having both a Random Access Memory (RAM) and a Serial Access Memory (SAM).

BACKGROUND OF THE INVENTION

Conventionally, an image memory has been used for processing image data to be displayed. Such an image memory is generally called a Dual Port Dynamic memory or a video RAM. In the following description, an image memory is called a VRAM.

Widely used as a VRAM is a combination of a multi-bit (multi word length) RAM and SAMs of the same number as the multi-bit number. The arrangement of a VRAM having a RAM of 128 k×8 bits (capacity: 128 k word-length, 8 bits) is shown in FIG. 7 by way of example. Specifically, there are provided eight planes of RAMs 2 of 256 columns×512 rows, and eight SAMs 4 of 256 words ×1 bit for transferring/receiving data to/from the RAMs. Eight input/output ports, i.e., eight RAM ports 8 and eight SAM ports 8a, are provided respectively for RAMs 2 and SAMs 4.

An example of the arrangement of a frame buffer memory using the VRAM constructed as above is shown in FIG. 8. The frame buffer memory shown in FIG. 8 is assumed to be used with an image screen of 1 k×1 k=1 M pixels. The screen image data are constructed of several planes containing color information and the like. In order to speed up the image processing, 4×4=16 pixels can be processed during one RAM cycle. Specifically, each pixel of sixteen pixels corresponds to one VRAM, and each plane corresponds to each bit of the multi-bit. Therefore, if sixteen VRAMs are used, it is possible to realize an eight-plane frame buffer memory for 16×128 k pixels. In some cases, more than eight planes become necessary. In such a case, one pixel of sixteen pixels may correspond to several VRAMs. For the purpose of simplicity, only a single plane is considered in the following description. A screen image is formed by sixteen VRAMs. In FIG. 8 each pixel is assigned a particular reference number. Pixel data are transferred to every scan line of a CRT in order, from the top of the screen. In this case, the data are serially output from a SAM of VRAM. Considering the first scan line, four VRAMs corresponding to pixels 1, 2, 3 and 4 have the data of this line. In the following description, each VRAMs corresponding to each of the other pixels is assigned a reference number the same as each of the corresponding pixels.

FIG. 9 illustrates the transfer of data of each VRAM to the CRT. A switch 10 shown in FIG. 9 selects a parallel/serial converter 12 or 13. In the parallel/serial converters 12 and 13, data are shifted at the pixel display speed on the CRT. Until such time when all the sets of the first four-pixel data on the top scan line have been transferred from the parallel/serial converter 12 to the CRT, the data in SAM 4 of the VRAMs 1 to 4 are transferred to the parallel/serial converter 13. When there is no more data in the parallel/serial converter 12, the switch 10 is actuated to transfer the data this time from the parallel/serial converter 13. The above operations are repeated until all the data on the first scan line on the image screen have been transferred from the parallel/serial converters 12 and 13, alternately. At the second scan line, instead of the data from VRAMs 1 to 4, the data from VRAMs 5 to 8 are transferred. As described above, the parallel/serial converters 12 and 13 are alternately used to continuously transfer data to the CRT.

As understood from the above-described data transfer method, assuming that the transfer cycle time determined by the image screen pixel display speed is $\tau$, then it is necessary to set a serial cycle time of the SAM in the VRAM to $4\tau$.

Consider that the number of pixels is increased to obtain a finer screen image. FIG. 10 shows the screen size of 2 k×2 k=4 M pixels. In order not to change the image processing speed such as the screen image data change speed, the number of pixels to be processed during one cycle of RAM is required to be increased by multiplying by a factor corresponding to an increase of the number of pixels on the image screen. The number of pixels to be processed at a time therefore becomes 8×8 =64. In order not to change the screen image display speed irrespective of an increase of the pixel number, it is necessary to change the pixel transfer cycle time to a time divided by the factor, i.e., $\tau/4$. In the case where the data in VRAMs 1 to 8 shown in FIG. 10 are transferred via eight-pixel parallel/serial converters such as shown in FIG. 9, the serial cycle time of VRAM becomes $8\times\tau/4 = 2\tau$. This serial cycle time is half of the $4\tau$ required for a 1 M size image screen. The minimum value of the serial cycle time is 30 ns for VRAM that are presently available. If a serial cycle time of 15 ns is required because of an increase of pixels by 4 times for the improvement of an image quality, it is difficult from the viewpoint of current circuit technology to realize VRAM satisfying a serial cycle time of 15 ns. To allow the use of VRAM now available in realizing a finer screen image, a measure to solve this problem has been long desired.

SUMMARY OF THE INVENTION

The present invention has been made in consideration of the above problems, and seeks to provide a video memory device capable of processing image data at high speed, without making a serial cycle time of the SAM in the VRAM short, and without increasing the time required for screen image display.

According to a video memory device of this invention, a plurality of SAMs are connected to a RAM for each bit of the input/output data of the RAM which allow the input/output of data for a plurality of bits. The data for a plurality of pixels can therefore be transferred during one serial cycle for the data display on an image screen.

According to another video memory device of this invention, a certain column of RAM is connected to a single SAM so that only this specific SAM connected to the column is used for the data input/output.

According to another video memory device of this invention, a certain column is multiple-connected to a plurality of SAMs so that the data can be input/output via any of the plurality of SAMs.

BRIEF DESCRIPTION OF THE DRAWINGS

FIG. 6 illustrates another embodiment of a video memory device according to the present invention;

DESCRIPTION OF THE PREFERRED EMBODIMENTS

The preferred embodiments of the present invention will be described with reference to the accompanying drawings.

Figure 1:
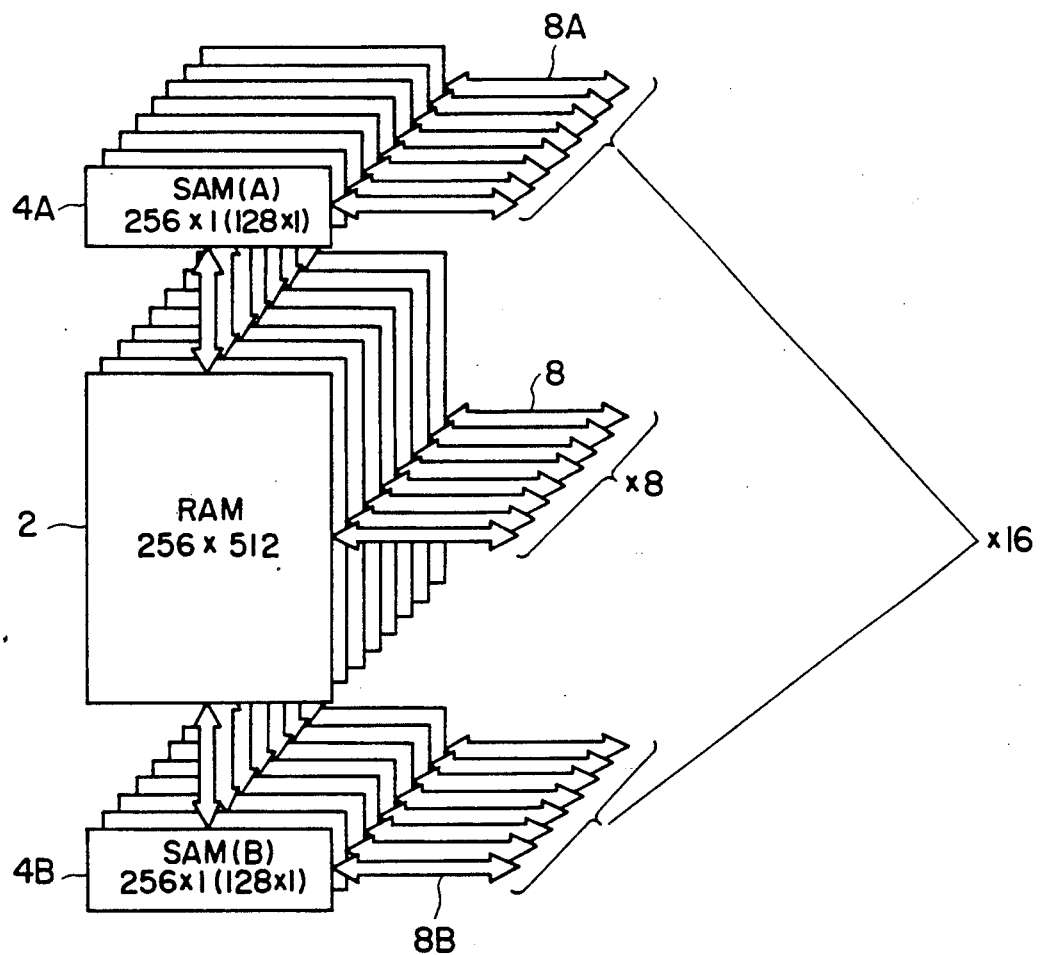
FIG. 1 illustrates an embodiment of a video memory device according to the present invention.

FIG. 1 shows an embodiment of a video memory device according to the present invention, wherein the memory device has a Random Access Memory (RAM) of 128 k×8 bits by way of example. In the video memory device of this embodiment, each of eight RAMs of 256 columns×512 rows (128 k) is provided with two Serial Access Memories (SAMs) 4A and 4B. RAM 2 is provided with an input/output port (RAM port) 8, and each SAM 4A, 4B is provided with an input/output port (SAM port) 8A, 8B, respectively.

SAM 4A, 4B is either 256 words×2 or 128 words×2 depending upon the data transfer connection to RAM 2.

15 Specifically, the background art uses the arrangement of RAM 2 of 128 k×8 bits, and SAM 4 of 256×8 bits, whereas this embodiment features in the arrangement of RAM 2 of 128 k×8 bits, and SAMs 4A and 4B in combination either of 256×16 bits or of 128×16 bits.

The difference between 256×2 and 128×2 of data transfer of either SAM 4A or 4B will be described.

Figure 2:
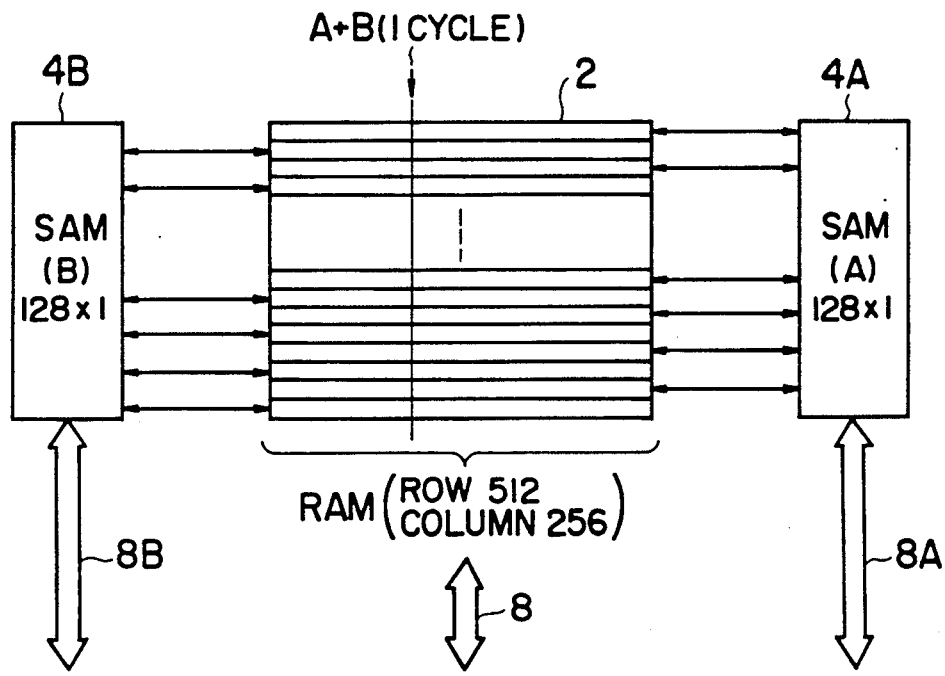
FIGS. 2 and 3 show examples of data transfer between RAMs and SAMs of the first embodiment shown in FIG. 1.

The 128×2 data transfer (transmit) is illustrated in FIG. 2. 256 columns of RAM 2 are divided into two sets each having 128 columns of every other column. The columns are alternately connected to SAM 4A and SAM 4B. In the case of 128×2 data transfer shown in FIG. 2, the data in RAM 2 can be transferred to SAM 4A and SAM 4B during one transfer cycle. Data transfer between RAM 2 and SAMs 4A and 4B are carried out in the following manner. For example, the data at a row indicated at (A+B) in FIG. 2 are transferred alternately for every other column to the SAMs 4A and 4B, whereas the data from the SAMs 4A and 4B are transferred alternately for every other column to RAM 2.

Figure 3:
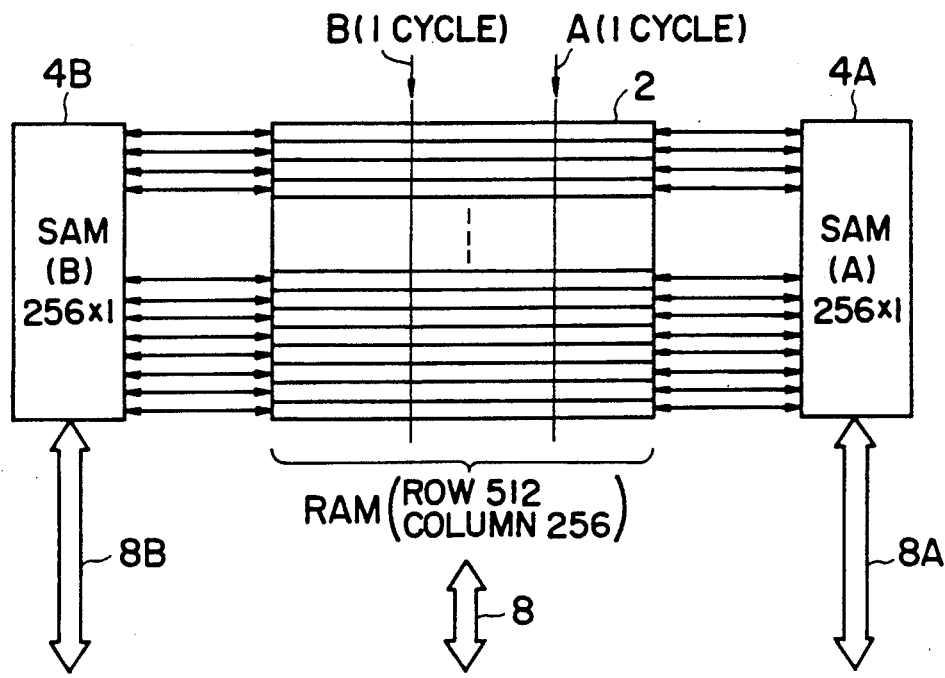

The 256×2 data transfer is illustrated in FIG. 3. All 256 columns of RAM 2 are connected to both SAMs 4A and 4B. If the data transfer to SAMs 4A and 4B is carried out during one transfer cycle, the same data are transferred to SAMs 4A and 4B. In order to transfer different data to SAMs 4A and 4B, it is necessary to provide a transfer gate between RAM 2 and SAM 4A and between RAM 2 and SAM 4B, and to execute the transfer cycle twice. For example, the data at the row indicated at A in FIG. 3 are transferred to SAM 4A during the first transfer cycle, and the data at the row indicated at B in FIG. 3 are transferred to SAM 4B during the second transfer cycle. The same data at row A in RAM 2 can therefore be transferred to SAM 4A, and the same data at row B in RAM 2 to SAM 4B.

There is a difference in practical application between the two types of data transfer between RAM 2 and SAMs 4A and 4B. In both cases, however, high speed display of image on a screen can be realized without using a shorter serial cycle time for SAMs 4A and 4B.

Figure 9:
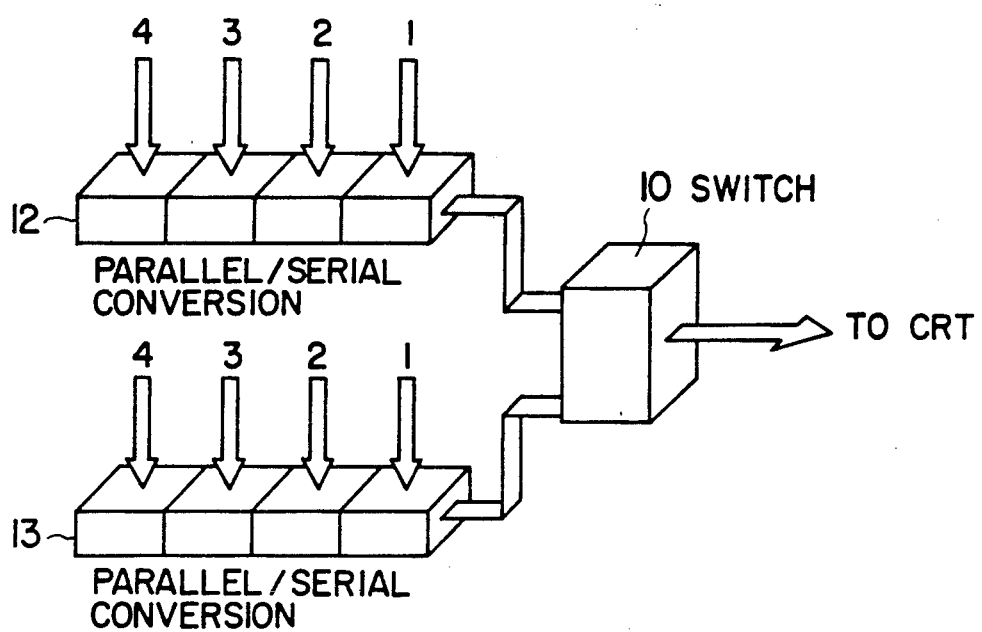
FIG. 9 illustrates the parallel/serial conversion for image data.
Figure 10:
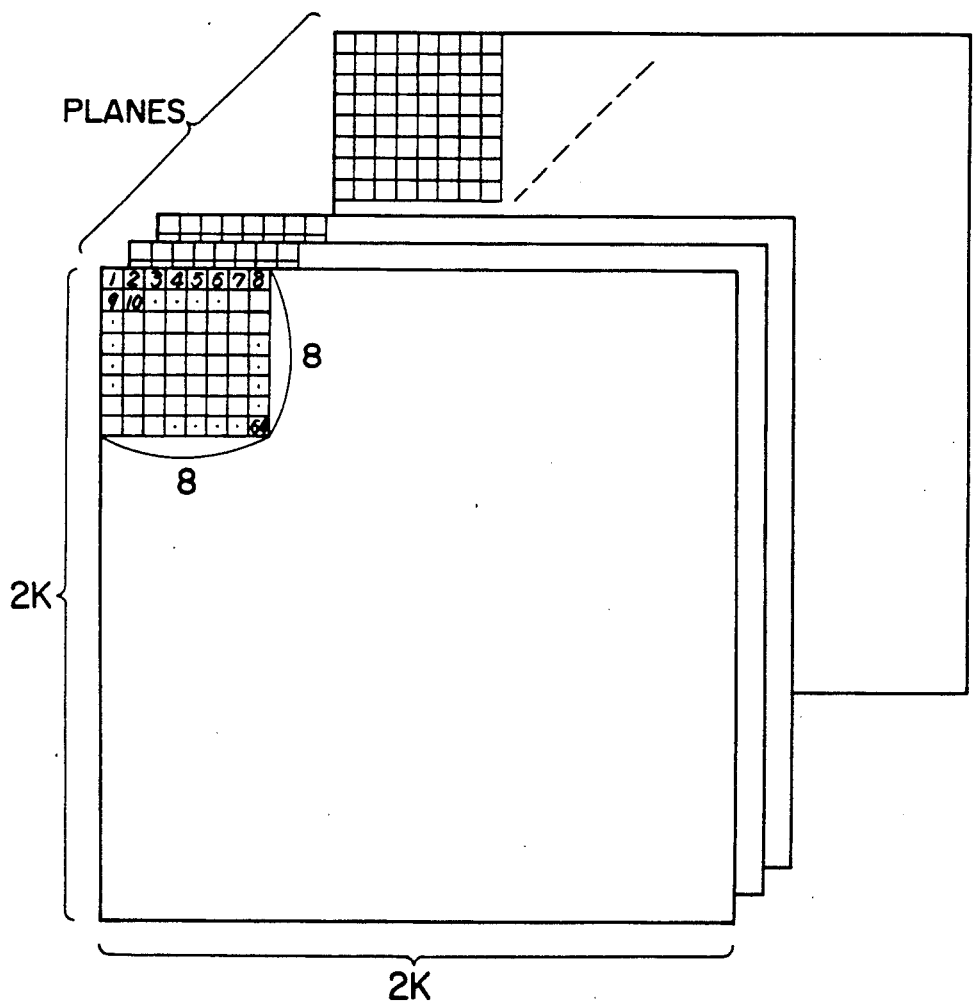
FIG. 10 illustrates a pixel assignment to a VRAM for an image data plane having a screen size of 4 M pixels according to the background art.

Consider that one plane is constructed of 8×8 =64 VRAMs for the screen image of 4 M pixels the same as that shown in FIG. 10. In the similar manner as described previously, the data on the first scan line on the image screen are obtained from VRAMs 1 to 8. In this embodiment, as shown in FIG. 1, there are two outputs in one plane of VRAM. Therefore, during one SAM serial cycle time, each VRAM outputs two pixel data so that the parallel/serial conversion shown in FIG. 9 is conducted for 8×2=16 pixels. Consequently, the SAM serial cycle time becomes (16×τ/4=) 4τ which is the same as that for the screen image size of 1 M pixels.

Figure 4:
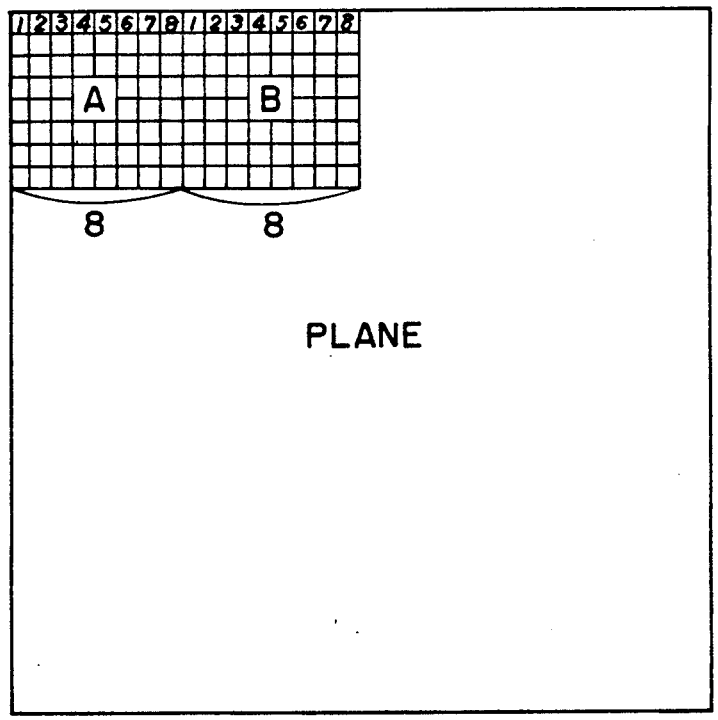
FIG. 4 illustrates a pixel assignment to a VRAM for the image data plane having a screen size of 4 M pixels.
Figure 5:
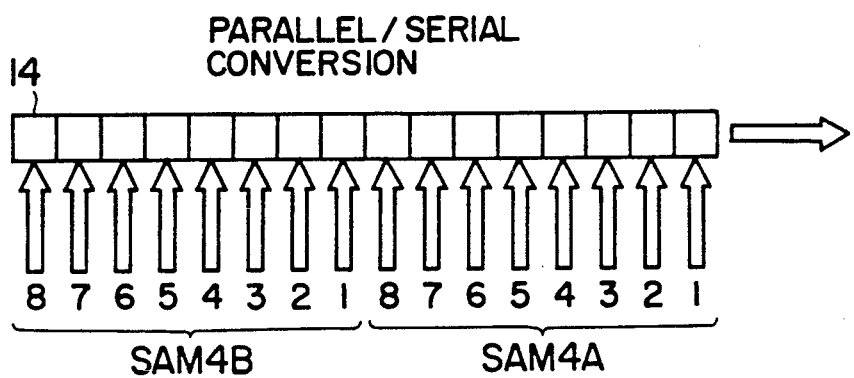
FIG. 5 illustrates the parallel/serial conversion for the image data shown in FIG. 4.
Figure 7:
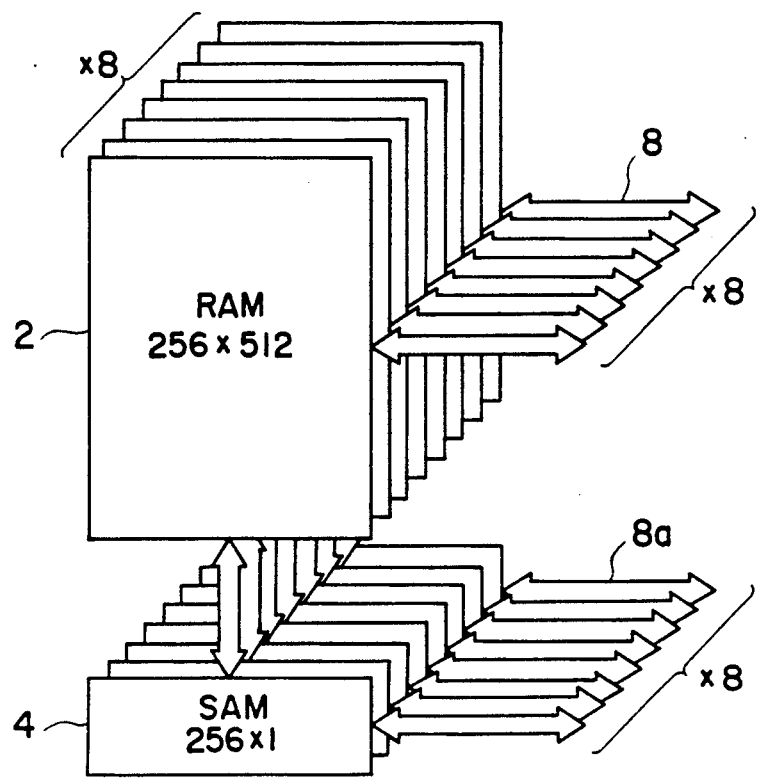
FIG. 7 illustrates a video memory device according to the back art.
Figure 8:
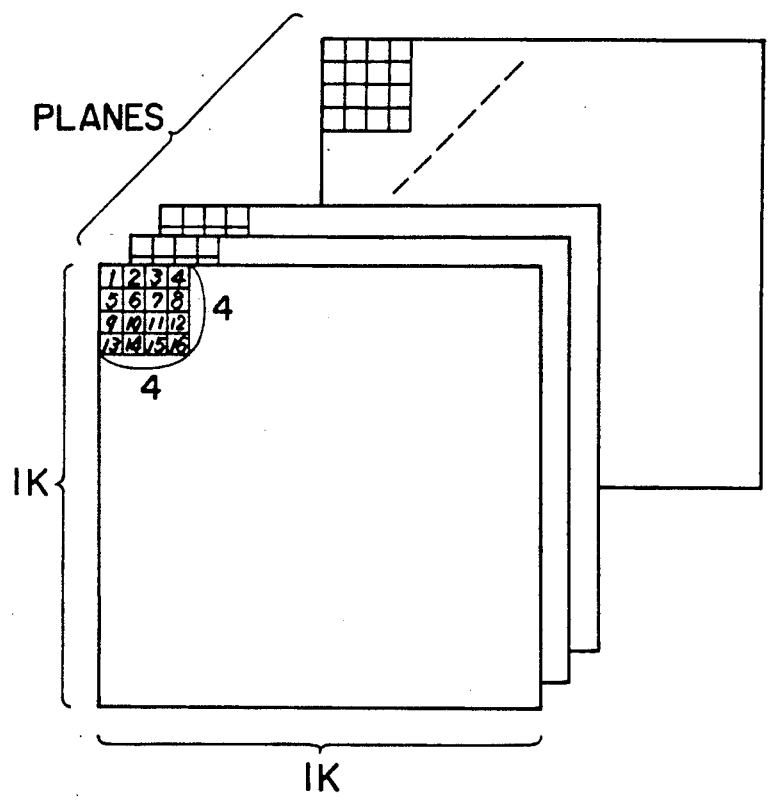
FIG. 8 illustrates a pixel assignment to VRAM for an image data plane having a screen size of 1 M pixels.

The embodiment will further be described in more detail while considering the difference between the 128×2 and 256×2 data transfer. In order to process image data at high speed, it is necessary for the pixels assigned to 8×8=64 VRAMs for one screen image plane to be collectively located within a single predetermined region. The reason for this is that the region of 64 pixels can be processed at a time during one RAM cycle to allow efficient processing of a local screen image. In the case where two pixel data are output from SAMs 4A and 4B, sixty four VRAMs cover the region of 64×2=128 pixels. In this case, the pixel data output from the SAMs 4A and 4B should not be contained in the same region. If the pixel regions of the SAMs 4A and 4B are contained in the same region, it means that two pixel data of the same SAMs 4A or 4B are present in the same 64 pixel region. The data of only one VRAM can be processed during one RAM cycle so that if two pixel data belonging to the same VRAM are present in the same 64 pixel region, two RAM cycles are required for processing the 64 pixel region, to thereby reduce the processing speed. The assignment of 64 VRAMs and SAMs 4A and 4B on the plane is therefore made as shown in FIG. 4. The parallel/serial conversion for a first line on the screen is carried out with one parallel/serial converter 14 connected to SAMs 4A and 4B, as shown in FIG. 5.

The difference between the constructions (arrangements) 128×2 and 256×2 of SAMs 4A and 4B results in a difference of screen image processing. In consecutively processing images at the A and B regions shown in FIG. 4, two cycles are necessary for changing the row address of RAM 2, because A and B belong to different rows in the case where construction is 256×2 shown in FIG. 3. Alternatively, in the case of the construction of 128×2 shown in FIG. 2, since the regions A and B have the same row addresses, it is sufficient if only the column address is changed, which allows the use of a RAM page mode and realizes a high speed processing. As is well known in the art, in the page mode, a column in a same row can be accessed by an access time approximately a half of the cycle time when the column is accessed by changing the row address. From the viewpoint of image data processing speed, the construction of 128×2 is advantageous.

The construction of 256×2 shown in FIG. 3 has also an advantage in practical application originating from the fact that two SAMs 4A and 4B are coupled to the same column. One example for this is a split buffering method in which the serial input/output can be transferred asynchronously with the serial cycle when transferring data between RAM and SAM. Specifically, SAMs are divided into two groups, the one group being accessed during the first half of the serial access time and the other group being accessed during the latter half. While the one group inputs/outputs a serial data, the other group transfers/receives data to/from RAM. The arrangement of a video memory device applicable to the split buffering method with the whole SAMs being divided into two groups is shown in FIG. 6 in block diagram. As shown in FIG. 6, SAMs are constructed of SAMs 4AU, 4AL, 4BU and 4BL. SAMs 4AU and 4AL are arranged to be independently controllable from SAMs 4BU and 4BL. Namely, the input/output mode changing for SAMs 4AU and 4AL can be carried out independently from that of the input/output mode for SAMs 4BU and 4BL. A split selector 6A is connected to SAMs 4AU and 4AL to selectively connect one of them to an input/output port 8A. Another split selector 6B is connected to SAMs 4BU and 4BL to selectively connect one of them to an input/output port 8B. In the arrangement of 256×2 shown in FIG. 3, it is possible to use VRAM as a FIFO (First In First Out) memory by setting SAM 4A at an input mode and SAM 4B at an output mode to thereby continuously input serial data from SAM 4A to RAM 2 and output serial data from RAM 2 to SAM 4B. In addition, if different signals are supplied independently via different input terminals to SAMs 4A and 4B to thereby independently control the serial cycle of SAMs 4A and 4B, SAMs 4A and 4B can operate asynchronously with each other. Therefore, the VRAM of this arrangement can be used as a buffer for data transfer between systems having different data transfer speeds. As described above, the VRAM of this embodiment can have various other functions.

The number of data transfer cycles required for the screen image display from RAM to SAM in VRAM is the same for both the arrangement of 256×2 shown in FIG. 3 and the arrangement of 128×2 shown in FIG. 2, because the quantity of data capable of being transferred is the same during one transfer cycle. However, the timings of the transfer cycle are different for both the data transfer operations. In the 256×2 shown in FIG. 2, since it is necessary to transfer data to SAMs 4A and 4B, during a pair of two cycles the data should be transferred to SAMs 4A and 4B. On the other hand, in the 128×2 shown in FIG. 2, the data are transferred to SAMs 4A and 4B during one transfer cycle so that the data are separately transferred during the times each having a half of the interval between the pair of two cycles for the 256×2.

I claim:

1. A video memory device comprising a RAM and a plurality of SAMs, wherein
    said RAM is constructed of a plurality of memory cells disposed in a matrix having a plurality of rows and columns, one of said memory cells being selected through designation by row and column addresses, and one bit data being transmitted between said selected memory cell and a RAM port, said one bit data being input/output to/from the RAM port; and wherein
    each of said SAMs is constructed as a multi-word length type and connected to a plurality of columns of said RAM, and each of said SAMs transmits/receives data to/from said memory cells belonging to said columns connected to said each of said SAMs, and each of said SAMs has one SAM port for inputting/outputting data and each of said SAMs inputs/outputs data from/to the SAM port, and said plurality of SAMs is adapted to output data at the same time, whereby the data in said RAM are input/output as multi-bit data via said plurality of SAM ports of said plurality of SAMs.

2. A video memory device according to claim 1, wherein each of said plurality of columns is connected to one of said SAMs.

3. A video memory device according to claim 1, wherein each of said plurality of columns is multiple-connected to a plurality of said SAMs.

4. A video memory device according to claim 1, wherein each of said SAMs is divided into first and second groups, the first group being accessed during the first half of a serial access time of said SAMs and the second group being accessed during the second half of said serial access time, and while one of said first and second groups serially outputs/inputs data, the other of said first and second groups transmits/receives data to/from said RAM.

5. A video memory device according to claim 4, wherein each of said plurality of SAMs is made capable of being set at one of serial input and output modes, independently of each other.

6. A video memory device according to claim 5, wherein said first and second groups are alternately connected to said SAM ports by split selectors for the serial data input/output.

7. A video memory device according to claim 4, wherein said first and second groups are alternately connected via split selectors to said SAM ports for the serial data input/output.

8. A video memory device according to claim 1, wherein each of said plurality of SAMs is made capable of being set at one of serial input and output modes, independently of each other.

9. A video memory device according to claim 1, wherein each of said plurality of SAMs is made capable of being set with a serial cycle time independently of each other, and each of said SAMs is made capable of being set with a serial cycle time asynchronously.

10. A video memory device comprising a RAM and a plurality of SAMs, wherein
    said RAM is constructed of a plurality of memory cells disposed in a matrix having a plurality of rows and columns, one of said memory cells being selected through designation by row and column addresses, and one bit data being transmitted between said selected memory cell and a RAM port, said one bit data being input/output to/from the RAM port; and wherein
    each of said SAMs is constructed as a multi-word length type and connected to a plurality of columns of said RAM, and each of said SAMs transmits/receives data to/from said memory cells belonging to said columns connected to said each of said SAMs, and each of said SAMs inputs/outputs data from/to the SAM port, whereby the data in said RAM are input/output as multi-bit data via said plurality of SAM ports of said plurality of SAMs, and wherein each of said SAMs is divided into first and second groups, the first group being accessed during a first half of a serial access time and said SAMs and the second group being accessed during a second half of said serial access time, and while one of said first and second groups serially outputs- /inputs data, the other of said first and second groups transmits/receives data to/from said RAM.

11. A video memory device according to claim 10, wherein each of said plurality of SAMs is made capable of being set at one of serial input and output modes, independently of each other.

12. A video memory device according to claim 11, wherein said first and second groups are alternately connected to said SAM ports by split selectors for the serial data input/output.

13. A video memory device according to claim 10, wherein said first and second groups are alternately connected via split selectors to said SAM ports for the serial data input/output.

* * * * *